(12) United States Patent
Kato

(10) Patent No.: US 10,920,316 B2
(45) Date of Patent: Feb. 16, 2021

(54) SUBSTRATE PROCESSING APPARATUS

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 16/431,972

(22) Filed: Jun. 5, 2019

(65) Prior Publication Data

US 2019/0382894 A1 Dec. 19, 2019

(30) Foreign Application Priority Data

Jun. 15, 2018 (JP) .................. 2018-114827

(51) Int. Cl.
| | | |
|---|---|---|
| C23C 16/455 | (2006.01) | |
| C23C 16/44 | (2006.01) | |
| C23C 16/34 | (2006.01) | |
| C23C 16/40 | (2006.01) | |
| C23C 16/458 | (2006.01) | |

(52) U.S. Cl.
CPC ........ *C23C 16/45544* (2013.01); *C23C 16/34* (2013.01); *C23C 16/401* (2013.01); *C23C 16/4412* (2013.01); *C23C 16/4584* (2013.01); *C23C 16/45536* (2013.01)

(58) Field of Classification Search
CPC ... C23C 16/4584; C23C 16/34; C23C 16/401; C23C 16/45536; C23C 16/45544; C23C 16/4412; C23C 16/45551
See application file for complete search history.

(56) References Cited

FOREIGN PATENT DOCUMENTS

JP 2013-042008 2/2013

*Primary Examiner* — Yuechuan Yu
(74) *Attorney, Agent, or Firm* — IPUSA PLLC

(57) ABSTRACT

A substrate processing apparatus includes a process chamber, and a turntable disposed in the process chamber. A surface of the turntable receives a substrate along a circumferential direction. A process gas supply part includes a process gas discharge surface configured to supply a process gas to the turntable. A space partition extends from the process gas discharge surface toward a downstream side of the process gas discharge surface in a rotational direction of the turntable and is configured to cover a part of the turntable and to form a lower space and an upper space. An exhaust duct is disposed downstream of the space partition and extends along a radial direction of the turntable. The exhaust duct has a lower exhaust opening in its lateral surface lower than the space partition. An upper exhaust opening is disposed higher than the space partition.

10 Claims, 12 Drawing Sheets

SUBSTRATE PROCESSING APPARATUS

CROSS-REFERENCE TO RELATED APPLICATION

The present application is based upon and claims priority to Japanese Patent Application No. 2018-114827, filed on Jun. 15, 2018, the entire contents of which are incorporated herein by reference.

BACKGROUND OF THE INVENTION

1. Field of the Invention

The present disclosure relates to a substrate processing apparatus.

2. Description of the Related Art

Conventionally, as disclosed in Japanese Patent Application Publication No. 2013-42008, a film deposition apparatus is known that includes a process region to which BTBAS gas is supplied and a process region to which $O_3$ gas is supplied that are disposed along a circumferential direction of a turntable that rotates along a horizontal plane, an exhaust port provided outside the turntable to evacuate BTBAS gas in the process region, and an exhaust duct provided covering the exhaust port and extending from the outer edge of a substrate receiving region to the inner edge of the substrate receiving region in a vacuum chamber.

The exhaust duct includes a second exhaust opening at least on the inner edge side of the substrate receiving region. Because BTBAS gas discharged from the first processing gas nozzle flows toward the second exhaust opening, BTBAS gas is supplied with high uniformity in the radial direction of the wafer W, and a highly uniform film deposition process can be performed across the surface of the wafer.

SUMMARY OF THE INVENTION

Embodiments of the Present Invention provide a substrate processing apparatus solving one or more of the problems discussed above.

More specifically, the embodiments of the present disclosure provides a substrate processing apparatus for efficiently evacuating a gas flowing in an upper space and a lower space when a space partition member is provided in a process region in a processing chamber to divide the process region into the upper space and the lower space, and to facilitate rectification, adsorption and the like of a process gas.

According to an embodiment of the present invention, there is provided a substrate processing apparatus that includes a process chamber, and a turntable disposed in the process chamber. A surface of the turntable receives a substrate along a circumferential direction. A process gas supply part includes a process gas discharge surface configured to supply a process gas to the turntable. A space partition extends from the process gas discharge surface toward a downstream side of the process gas discharge surface in a rotational direction of the turntable and configured to cover a part of the turntable and to form a lower space between the space partition and the turntable, and an upper space between the space partition and a ceiling surface of the process chamber. An exhaust duct is disposed downstream of the space partition in the rotational direction of the turntable and extending along a radial direction of the turntable. The exhaust duct has a lower exhaust opening in its lateral surface at a first position lower than the space partition. An upper exhaust opening is disposed at a second position higher than the space partition.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF THE PREFERRED EMBODIMENTS

Embodiments of the present disclosure are described below with reference to the accompanying drawings.

[Configuration of Substrate Processing Apparatus]

Figure 1:
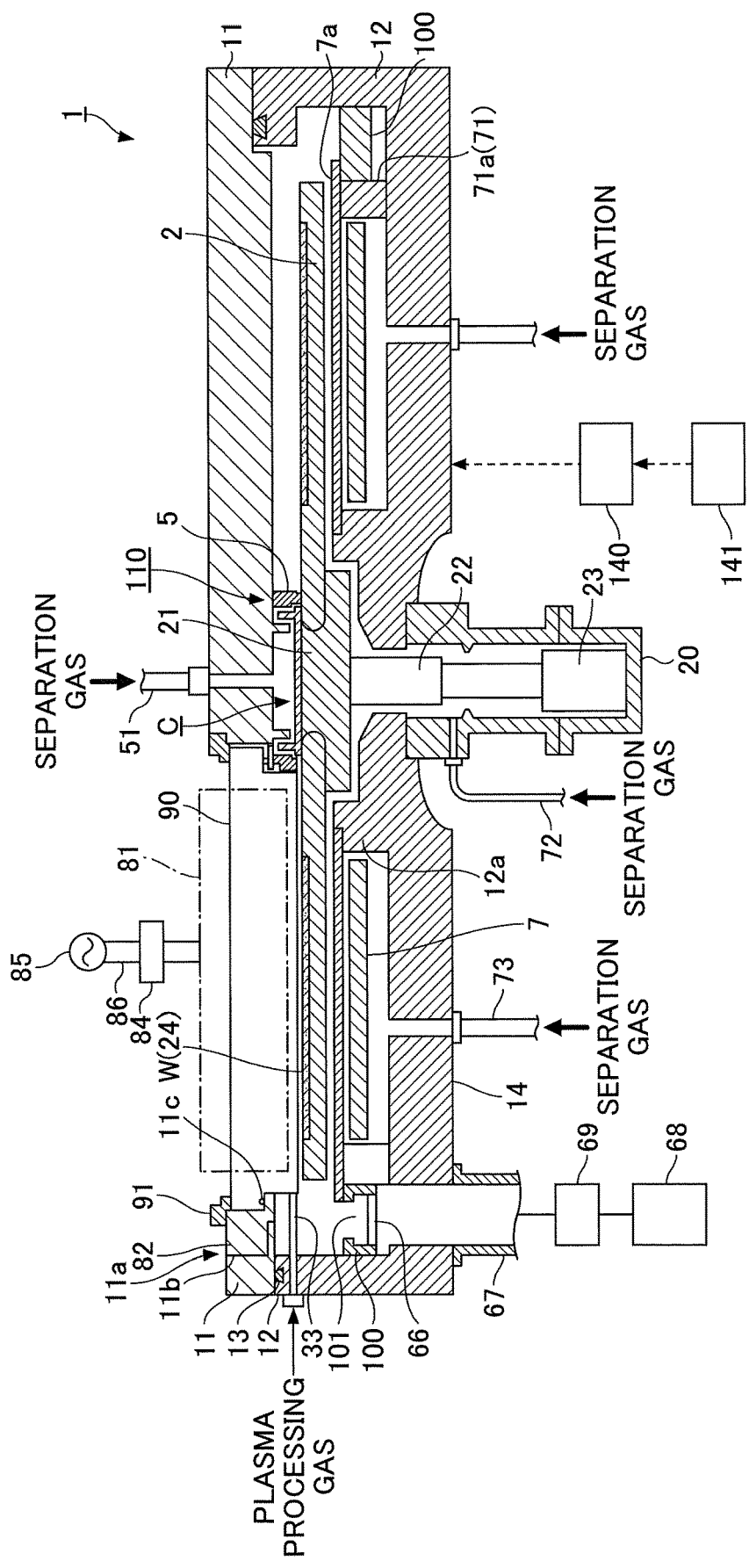
FIG. 1 is a schematic vertical cross-sectional view illustrating a substrate processing apparatus of an example according to an embodiment of the present disclosure.
Figure 2:
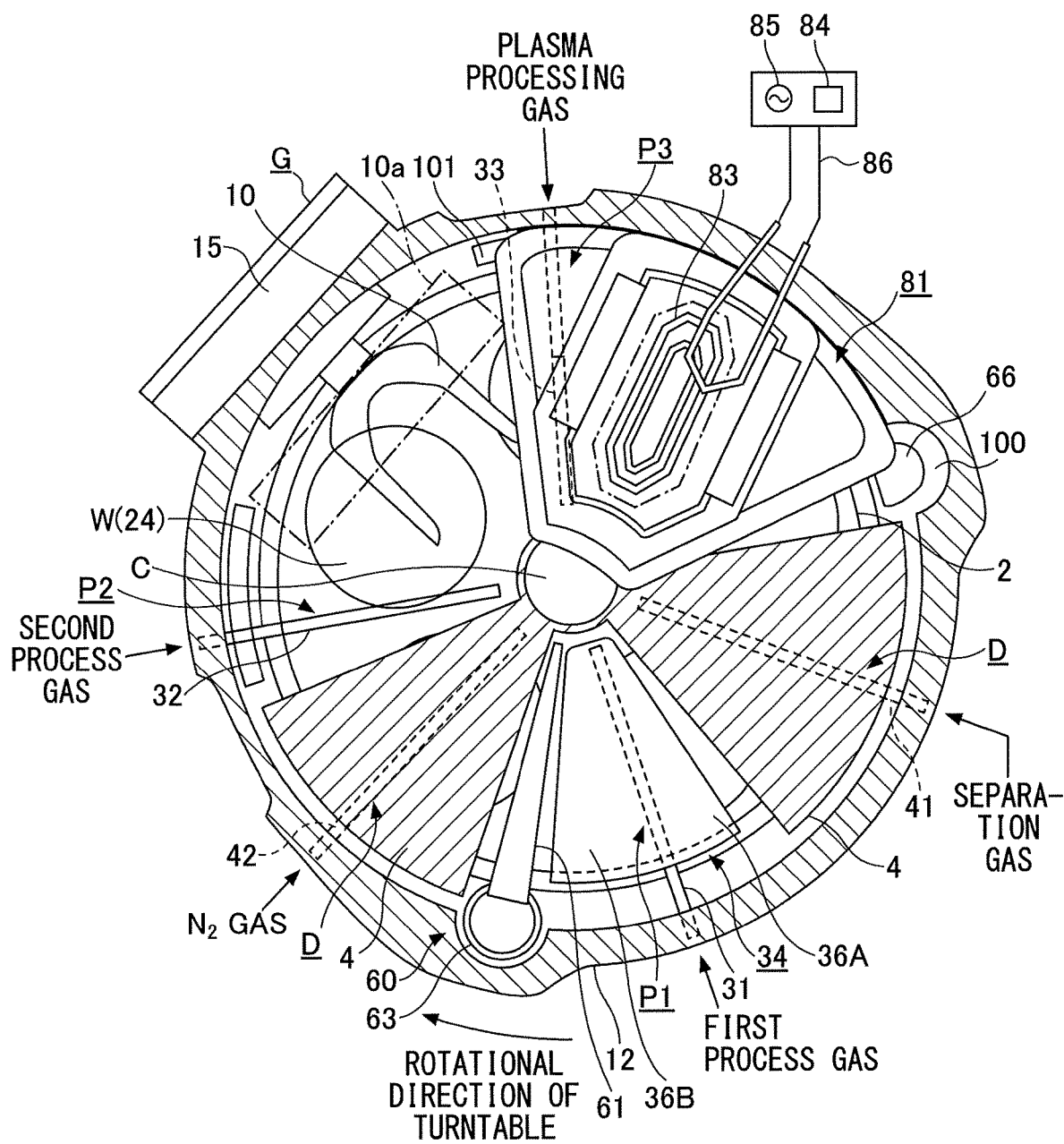
FIG. 2 is a schematic plan view illustrating a substrate processing apparatus of an example according to an embodiment of the present disclosure.

FIG. 1 is a schematic vertical cross-sectional view illustrating an example of a substrate processing apparatus according to an embodiment of the present disclosure. FIG. 2 is a schematic plan view illustrating an example of the substrate processing apparatus according to the embodiment. In FIG. 2, for convenience of explanation, a depiction of a top plate 11 is omitted.

As illustrated in FIG. 1, the substrate processing apparatus of the embodiment includes a vacuum chamber 1 having a substantially circular planar shape, and a turntable 2 that is disposed in the vacuum chamber 1 such that the rotational center of the turntable 2 coincides with the center of the vacuum chamber 1. The turntable 2 rotates wafers W placed thereon by rotating around its rotational center.

The vacuum chamber 1 is a process chamber to accommodate wafers W therein and to perform a plasma process on a film or the like deposited on surfaces of the wafers W. The vacuum chamber 1 includes a top plate (ceiling) 11 that faces concave portions 24 formed in a surface of the turntable 2, and a chamber body 12. A ring-shaped seal member 13 is provided at the periphery of the upper surface of the chamber body 12. The top plate 11 is configured to be attachable to and detachable from the chamber body 12. The diameter (inner diameter) of the vacuum chamber 1 in plan view is, for example, about 1100 mm, but is not limited to this.

A separation gas supply pipe 51 is connected to the center of the upper side of the vacuum chamber 1 (or the center of the top plate 11). The separation gas supply pipe 51 supplies a separation gas to a central area C in the vacuum chamber 1 to prevent different process gases from mixing with each other in the central area C.

A central part of the turntable 2 is fixed to an approximately-cylindrical core portion 21. A rotational shaft 22 is connected to a lower surface of the core portion 21 and extends in the vertical direction. The turntable 2 is configured to be rotatable by a drive unit 23 about the vertical axis of the rotational shaft 22, in a clockwise fashion in the example of FIG. 2. The diameter of the turntable 2 is, for example, but is not limited to, about 1000 mm.

The rotational shaft 22 and the drive unit 23 are housed in a case body 20. An upper-side flange of the case body 20 is hermetically attached to the lower surface of a bottom part 14 of the vacuum chamber 1. A purge gas supply pipe 72 is connected to the case body 20. The purge gas supply pipe 72 supplies a purge gas (separation gas) such as argon gas to an area below the turntable 2.

A part of the bottom part 14 of the vacuum chamber 1 surrounding the core portion 21 forms a ring-shaped protrusion 12a that protrudes so as to approach the turntable 2 from below.

Circular concave portions 24 (or substrate receiving areas), where the wafers W having a diameter of, for example, 300 mm are placed, are formed in the upper surface of the turntable 2. A plurality of (e.g., five) concave portions 24 are provided along the rotational direction of the turntable 2. Each of the concave portions 24 has an inner diameter that is slightly (e.g., from 1 mm to 4 mm) greater than the diameter of the wafer W. The depth of the concave portion 24 is substantially the same as or greater than the thickness of the wafer W. Accordingly, when the wafer W is placed in the concave portion 24, the height of the upper surface of the wafer W becomes substantially the same as or lower than the height of the upper surface of the turntable 2 where the wafers W are not placed. When the depth of the concave portion 24 is excessively greater than the thickness of the wafer W, it may adversely affect film deposition. Therefore, the depth of the concave portion 24 is preferably less than or equal to about three times the thickness of the wafer W. Through holes (not illustrated in the drawings) are formed in the bottom of the concave portion 24 to allow a plurality of (e.g., three) lifting pins (which are described later) to pass through. The lifting pins raise and lower the wafer W.

As illustrated in FIG. 2, a first process region P1, a second process region P2 and a third process region P3 are provided apart from each other along the rotational direction of the turntable 2. Because the third process region P3 is a plasma process region, it may be also referred to as a plasma process region P3 hereinafter. A plurality of (e.g., seven) gas nozzles 31, 32, 33, 34, 41 and 42 made of, for example, quartz are arranged at intervals in a circumferential direction of the vacuum chamber 1. The gas nozzles 31 through 33, 41 and 42 extend radially, and are disposed to face areas that the concave portions 24 of the turntable 2 pass through. The nozzles 31 through 33, 41 and 42 are placed between the turntable 2 and the top plate 11. Here, each of the gas nozzles 31 through 33, 41 and 42 extends horizontally from the outer wall of the vacuum chamber 1 toward the central area C so as to face the wafers W. In the example of FIG. 2, plasma processing gas nozzle 33, a separation gas nozzle 41, a first processing gas nozzle 31, a separation gas nozzle 42 and a second processing gas nozzle 32 are arranged in a clockwise fashion (the rotational direction of the turntable 2) from a transfer opening 15 in this order. Here, a gas supplied from the second processing gas nozzle 32 is often similar to a gas supplied from the plasma processing gas nozzle 33, but the second processing gas nozzle 32 may not be necessarily provided when the plasma processing gas nozzle 33 sufficiently supply the gas.

The first processing gas nozzle 31 forms a "first processing gas supply part". The plasma processing gas nozzle 33 forms a "plasma processing gas supply part". Each of the separation gas nozzles 41 and 42 forms a "separation gas supply part".

Each of the gas nozzles 31 through 33, 41 and 42 is connected to gas supply sources (not illustrated in the drawings) via a flow control valve.

Gas discharge holes 36 for discharging a gas are formed in the lower side (which faces the turntable 2) of each of the nozzles 31 through 33, 41 and 42. The gas discharge holes 36 are formed, for example, at regular intervals along the radial direction of the turntable 2. The distance between the lower end of each of the nozzles 31 through 33, 41 and 42 and the upper surface of the turntable 2 is, for example, from about 1 mm to about 5 mm.

An area below the first processing gas nozzle 31 is a first process region P1 where a first process gas is adsorbed on the wafer W. An area below the second processing gas nozzle 32 is a second process region P2 where a second process gas that can produce a reaction product by reacting with the first process gas is supplied to the wafer W. An area below the plasma processing gas nozzle 33 is a third process region P3 where a modification process is performed on a film on the wafer W. The separation gas nozzles 41 and 42 are provided to form separation areas D for separating the first process region P1 from the second process region P2, and separating the third process region P3 from the first process region P1, respectively. Here, the separation area D is not provided between the second process region P2 and the third process region P3. This is because the second process gas supplied in the second process region P2 and the mixed gas supplied in the third process region P3 partially contain a common component therein in many cases, and therefore the second process region P2 and the third process region P3 do not have to be separated from each other by particularly using the separation gas.

Although described in detail later, the first processing gas nozzle 31 supplies a source gas that forms a principal component of a film to be deposited. For example, when the film to be deposited is a silicon oxide film ($SiO_2$), the first processing gas nozzle 31 supplies a silicon-containing gas such as an aminosilane gas. The second processing gas nozzle 32 supplies an oxidation gas such as oxygen gas and ozone gas. The plasma processing gas nozzle 33 supplies a mixed gas containing the same gas as the second processing gas and a noble gas to perform a modification process on the deposited film. For example, when the film to be deposited is the silicon oxide film ($SiO_2$), the plasma processing gas nozzles 33 through 35 supply a mixed gas of the oxidation gas such as oxygen gas and ozone gas same as the second process gas and a noble gas such as argon and helium.

As illustrated in FIG. 3, a nozzle cover 34 is provided above the first processing gas nozzle 31. The nozzle cover 34 covers the first processing gas nozzle 31 from above, and includes fan-shaped current plates 36A and 36B that extend upstream and downstream in the rotational direction of the turntable 2. Details of the nozzle cover will be described later.

An exhaust part 60 is provided downstream of the nozzle cover 34 in the rotational direction of the turntable 2. The exhaust part 60 includes an exhaust duct 61 extending radially along the turntable 2 and an upper exhaust part 63 disposed outside the turntable 2. Details of the exhaust part 60 will be also described later.

Figure 3A:
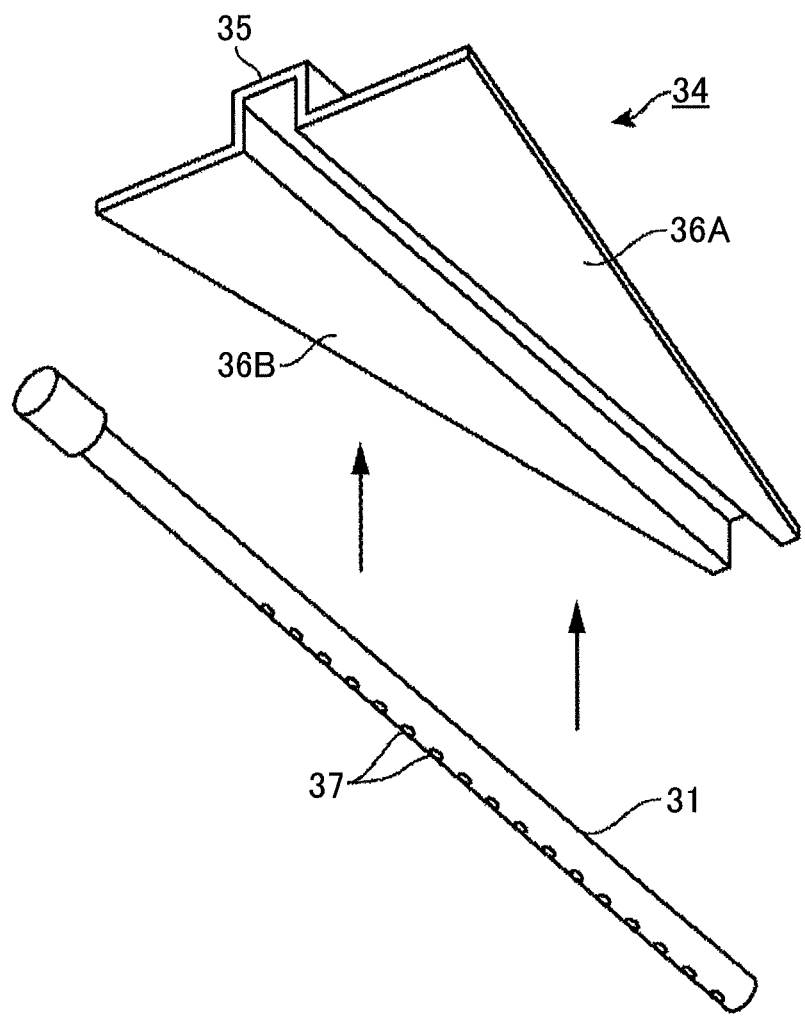
FIGS. 3A and 3B are diagrams illustrating a configuration of an example of a nozzle cover.

FIG. 3 is a diagram illustrating an exemplary configuration of a nozzle cover, and FIG. 3A illustrates a nozzle cover 34 provided for at least a process gas nozzle 31. The nozzle cover 34 is provided to supply a process gas to the wafer W (turntable 2) at a higher concentration. The nozzle cover 34 may optionally be provided not only for the first process gas nozzle 31, but also for the second process gas nozzle 32 and/or the plasma processing gas nozzle 33.

As illustrated in FIG. 3A, the nozzle cover 34 extends along the lengthwise direction of the process gas nozzle 31 and includes a cover 35 having a U-shaped cross section. The cover 35 is arranged to cover the first processing gas nozzle 31. The current plate 36A is attached to one end of the two longitudinally extending opening ends of the cover 35, and the current plate 36B is attached to the other end of the opening.

Figure 3B:
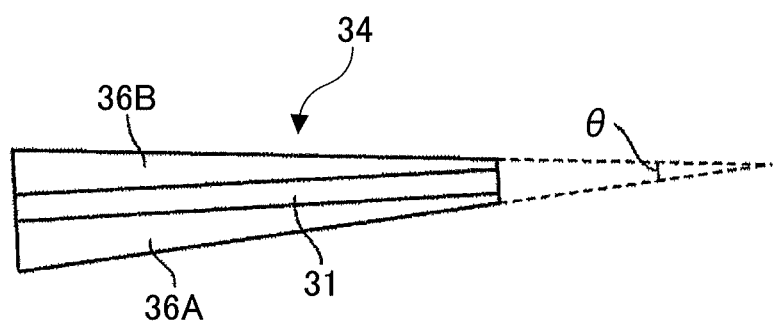

FIG. 3B is a diagram illustrating an example of a proportion between components of the nozzle cover 34. As illustrated in FIG. 3B, in the example of FIG. 3, current plates 36A and 36B are formed symmetrically in a lateral direction with respect to the central axis of the process gas nozzle 31, but may not necessarily be laterally symmetrical. For example, the current plate 36B downstream in the rotational direction of the turntable 2 may be formed wider than the upstream current plate 36A. FIG. 2 illustrates a configuration in which the current plate 36B on the downstream side is slightly wider than the current plate 36A on the upstream side.

The lengths along the rotational direction of the turntable 2 of the current plates 36A and 36B are lengthened toward the outer circumference of the turntable 2, so that the nozzle cover 34 has a generally fan-like shape in a plan view. Here, the opening angle of the fan-like shape illustrated by the dotted line in FIG. 3B is determined by considering the size of the convex portion 4 of the separation region D, but is preferably, for example, 5° or more to less than 90°, and more preferably, for example, 8° or more to less than 10°. By providing such a nozzle cover 34, the contact time between the process gas supplied from the first processing gas nozzle 31 and the wafer W can be extended to efficiently adsorb the process gas on the surface of the wafer W. Accordingly, if necessary, the nozzle cover 34 may be provided for one or more of the processing gas nozzles 31 and 32 and the plasma processing gas nozzle 33.

Figure 4:
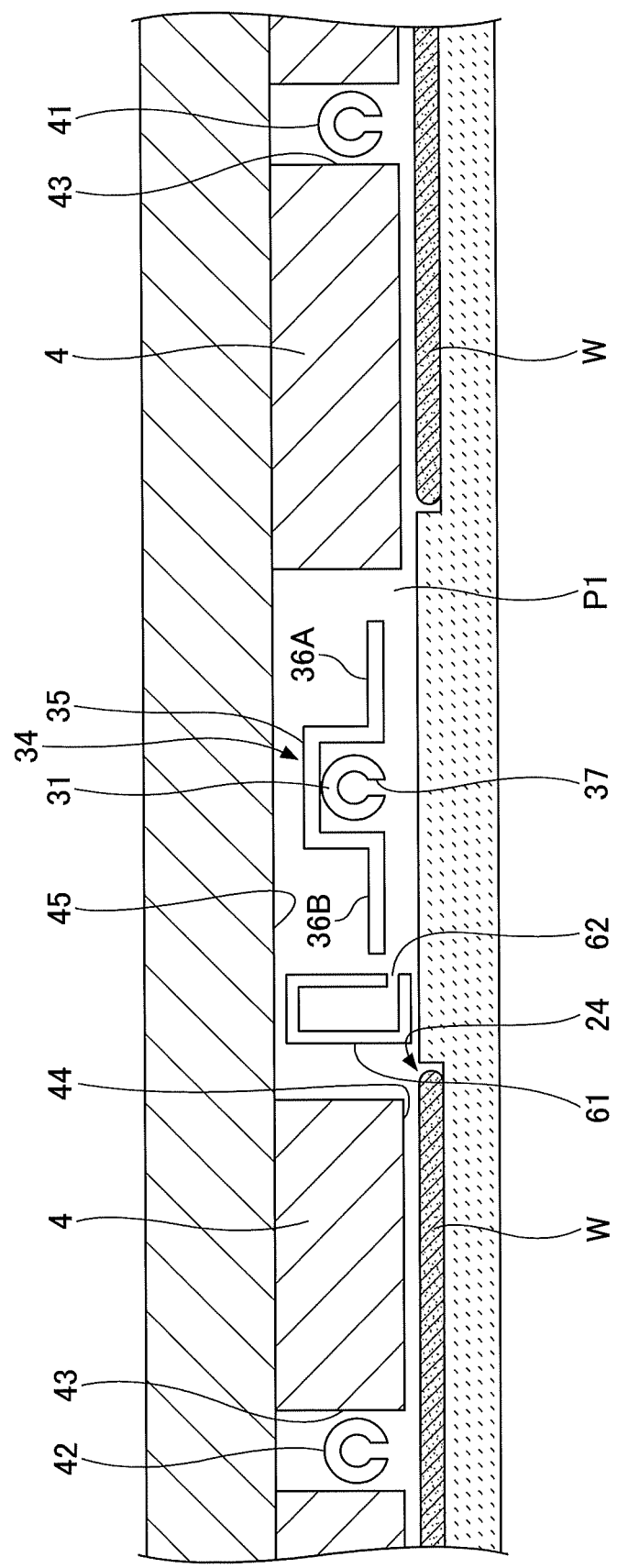
FIG. 4 is a cross-sectional view of a part of a substrate processing apparatus taken along a concentric circle of a turntable.

FIG. 4 illustrates a cross section of a part of the substrate processing apparatus taken along a concentric circle of the turntable 2. More specifically, FIG. 4 illustrates a cross section of a part of the substrate processing apparatus from one of the separation areas D to the other separation area D via the first process region P1.

Approximately fan-shaped convex portions 4 are provided on the lower surface of the top plate 11 of the vacuum chamber 1 at locations corresponding to the separation areas D. The convex portions 4 are attached to the back surface of the top plate 11. In the vacuum chamber 1, flat and low ceiling surfaces 44 (first ceiling surfaces) are formed by the lower surfaces of the convex portions 4, and ceiling surfaces 45 (second ceiling surfaces) are formed by the lower surface of the top plate 11. The ceiling surfaces 45 are located on both sides of the ceiling surfaces 44 in the circumferential direction, and are located higher than the ceiling surfaces 44.

As illustrated in FIG. 2, each of the convex portions 4 forming the ceiling surface 44 has a fan-like planar shape whose apex is cut off to form an arc-shaped side. Also, a groove 43 extending in the radial direction is formed in each of the convex portions 4 at the center in the circumferential direction. Each of the separation gas nozzles 41 and 42 is placed in the groove 43. A peripheral part of the convex portion 4 (a part along the outer edge of the vacuum chamber 1) is bent to form an L-shape to prevent the process gases from mixing with each other. The L-shaped part of the convex portion 4 faces the outer end surface of the turntable 2 and is slightly apart from the chamber body 12.

The nozzle cover 34 is provided above the first processing gas nozzle 31 to allow the first process gas to flow along the wafer W and to allow the separation gas to flow along the top plate 11 of the vacuum chamber 1 while flowing away from the vicinity of the wafer W. As illustrated in FIG. 4, the nozzle cover 34 includes a generally box-shaped cover 35 in which the lower surface opens to accommodate the first processing gas nozzle 31, and the current plates 36A and 36B, which have plate-shaped bodies connected to the lower ends of the box-shaped cover 35 extending upstream and downstream in the rotational direction of the turntable 2, respectively. The nozzle cover 34 serves as a space partition member that divides the first process region P1 into the upper space and the lower space. The side wall surface of the cover body 35 on the rotation center side of the turntable 2 extends toward the turntable 2 so as to face the leading end portion of the first processing gas nozzle 31. The side wall surface of the cover 35 on the outer edge of the turntable 2 is cut out to prevent interference with the first processing gas nozzle 31. A nozzle cover 34 is provided to cover the first processing gas nozzle 31 from above with the first processing gas nozzle 31 contained within the cover body 35 projecting upwardly to form a recess thereinside.

An exhaust duct 61 is provided downstream of the nozzle cover 34. The exhaust duct 61 is an exhaust unit for evacuating the process gas below the current plates 36A and 36B of the nozzle cover 34. A lower exhaust opening 62 is provided below the exhaust duct 61. The lower exhaust opening 62 is provided below the current plates 36A and 36B to evacuate the process gas flowing below the current plates 36A and 36B. By providing a lower exhaust opening 62 that opens laterally on the downstream side of the current plates 36A and 36B, the parallel flow below the current plates 36A and 36B can be evacuated without disturbing the parallel flow.

Figure 5:
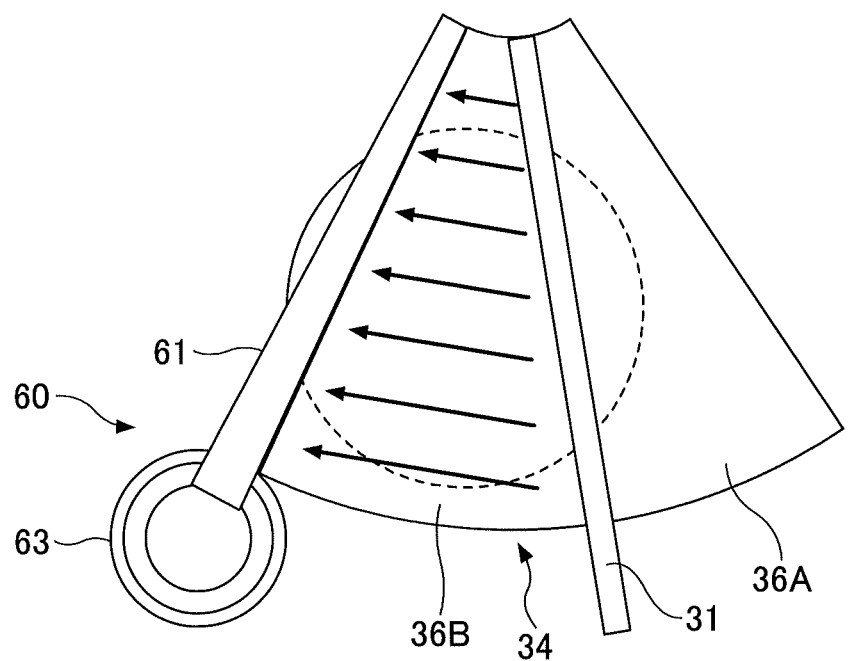
FIG. 5 is a top view of an exhaust part disposed in a first process region of a substrate processing apparatus according to an embodiment.

FIG. 5 is a top view of an exhaust part 60 provided in a first process region 21 of a substrate processing apparatus according to an embodiment of the present disclosure.

As illustrated in FIG. 5, a first processing gas nozzle 31 is covered with a nozzle cover 34, and an exhaust duct 61 is provided downstream of the nozzle cover 34, more specifically downstream of the current plate 36B. The exhaust duct 61 is provided extending radially along the turntable 2 from an outer position towards the center of the turntable 2. A lower exhaust opening 62 described in FIG. 4 is provided in a lateral surface on the nozzle cover 34 side of the exhaust duct 61 while facing the current plate 36B. The lower exhaust opening 62 may be one, but preferably, multiple lower exhaust openings 62 are arranged along the longitudinal direction (radial direction of the turntable 2) of the exhaust duct 61 in order to achieve uniform evacuation in the radial direction. By providing such an arrangement, it is possible to directly evacuate the process gas supplied from the first processing gas nozzle 31 and flowing along the rotational direction of the turntable 2 and to maintain the parallel flow in the lateral direction. Thus, uniform substrate processing can be achieved.

The shape of the exhaust duct 61 is preferably of a square shape in a cross-sectional view because the lateral surface is preferably flat, although the shape of the exhaust duct 61 is not limited as long as the exhaust duct 61 can evacuate the process gas. Thus, the lateral surface of the exhaust duct 61 on the upstream side can be made a surface substantially perpendicular to the turntable 2, while allowing the direction of the flow of the process gas to be the same as the orientation of the opening of the lower exhaust opening 62, thereby enabling an efficient evacuation. If the lateral surface of the exhaust duct 61 providing the lower exhaust opening 62 can be made an appropriate angle, the cross-sectional shape of the exhaust duct 61 may not be limited to a rectangular or square shape, but may be formed into another polygonal, circular (generally cylindrical or tubular) shape and the like.

In FIG. 5, an upper exhaust part 63 is illustrated. The upper exhaust part 63 is an exhaust unit positioned above the current plates 36A and 36B to primarily evacuate the separation gas ($N_2$, Ar, etc.) flowing over the nozzle cover 34.

Figure 6:
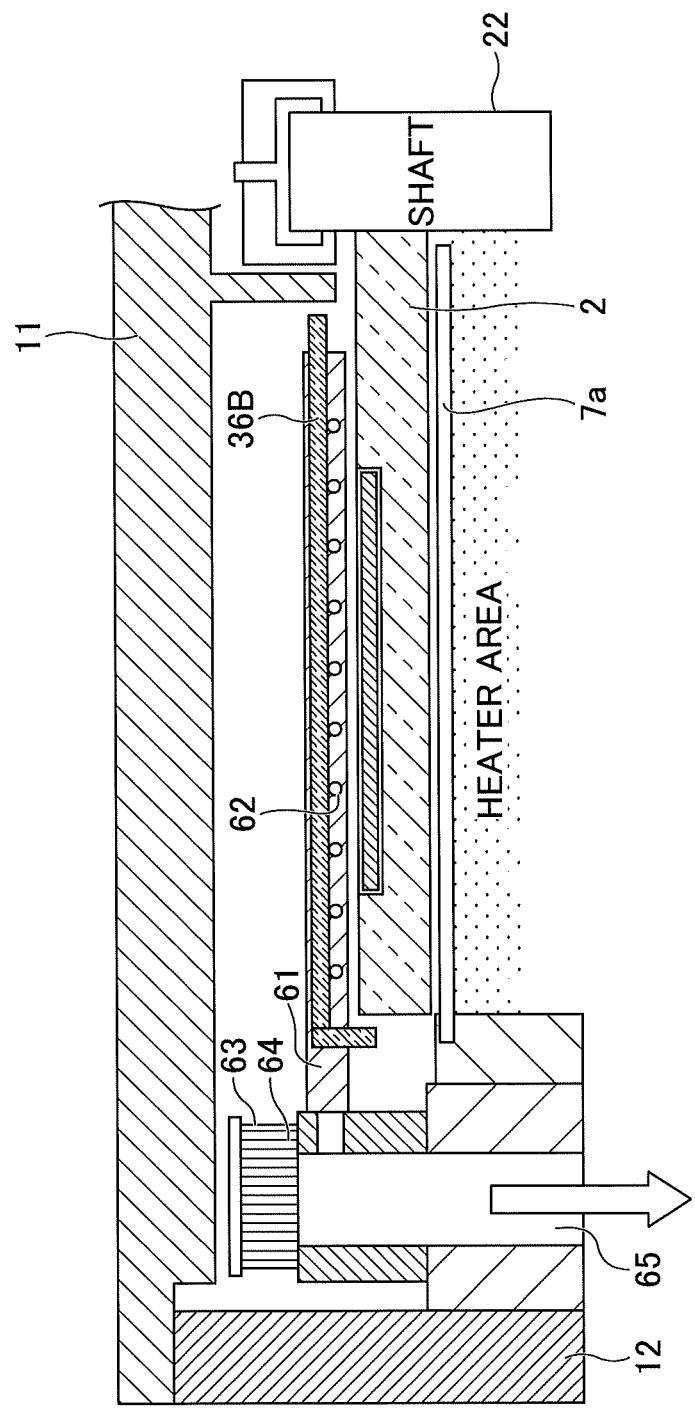
FIG. 6 is a cross-sectional view of an exhaust part of an example of a substrate processing apparatus according to an embodiment.

FIG. 6 is a cross-sectional view of an exhaust part 60 of an example of a substrate processing apparatus according to an embodiment of the present disclosure. As illustrated in FIG. 6, the exhaust part 60 includes an exhaust port 65 connected to an exhaust unit such as a vacuum pump and includes the exhaust duct 61 and the upper exhaust part 63 in communication with the exhaust port 65. The exhaust duct 61 includes a lower exhaust opening 62 at a position lower than the current plate 36B on its upstream side. As illustrated in FIG. 6, a plurality of lower exhaust openings 62 can be arranged along the radial direction of the turntable 2 to form a lateral parallel flow as illustrated in FIG. 5.

The upper exhaust part 63 is provided at the upper end of the exhaust port 65. An upper exhaust opening 64 is provided on the outer peripheral surface of the upper exhaust part 63 to evacuate the separation gas flowing upstream of the current plates 36A and 36B. As illustrated in FIG. 6, the upper exhaust opening 64 of the upper exhaust part 63 is positioned above the current plates 36A and 36B, and is configured to evacuate the separation gas more than the process gas. As long as the upper exhaust opening 64 can evacuate the separation gas more than the process gas, the configuration of the upper exhaust opening 64 is not limited. As illustrated in FIG. 6, the upper exhaust opening 64 may be configured to have a cylindrical circumferential surface with a plurality of openings. In FIG. 6, vertically extending many upper exhaust openings 64 are formed along the outer circumferential surface of the cylindrical upper exhaust part 63.

The exhaust duct 61 and the upper exhaust part 63 are connected to the vertically extending exhaust port 65, and are configured to be able to evacuate a gas by an exhaust unit such as a vacuum pump. Such a configuration allows the process gas to be evacuated more than the separation gas via the exhaust duct 61, and the separation gas to be evacuated by the upper exhaust part 63, thereby efficiently balancing the evacuation between from the upper portion and from the lower portion. Thus, a parallel flow of the process gas is formed laterally along the surface of the turntable 2, while allowing uniform adsorption of the source gas on the surface of the wafer W, thereby improving the uniformity of the film deposition across the surface.

As illustrated in FIGS. 2 and 5, the exhaust part 60, particularly the exhaust duct 61, is preferably disposed in the vicinity of the current plate 36B on the downstream side without having a long distance from the nozzle cover 34. Thus, uniform and efficient evacuation and substrate processing can be achieved without disturbing the flow of the process gas.

As illustrated in FIG. 2, a plasma generator 81 is provided above the plasma processing gas nozzle 33 to convert a plasma processing gas discharged into the vacuum chamber 1 to plasma.

Figure 7:
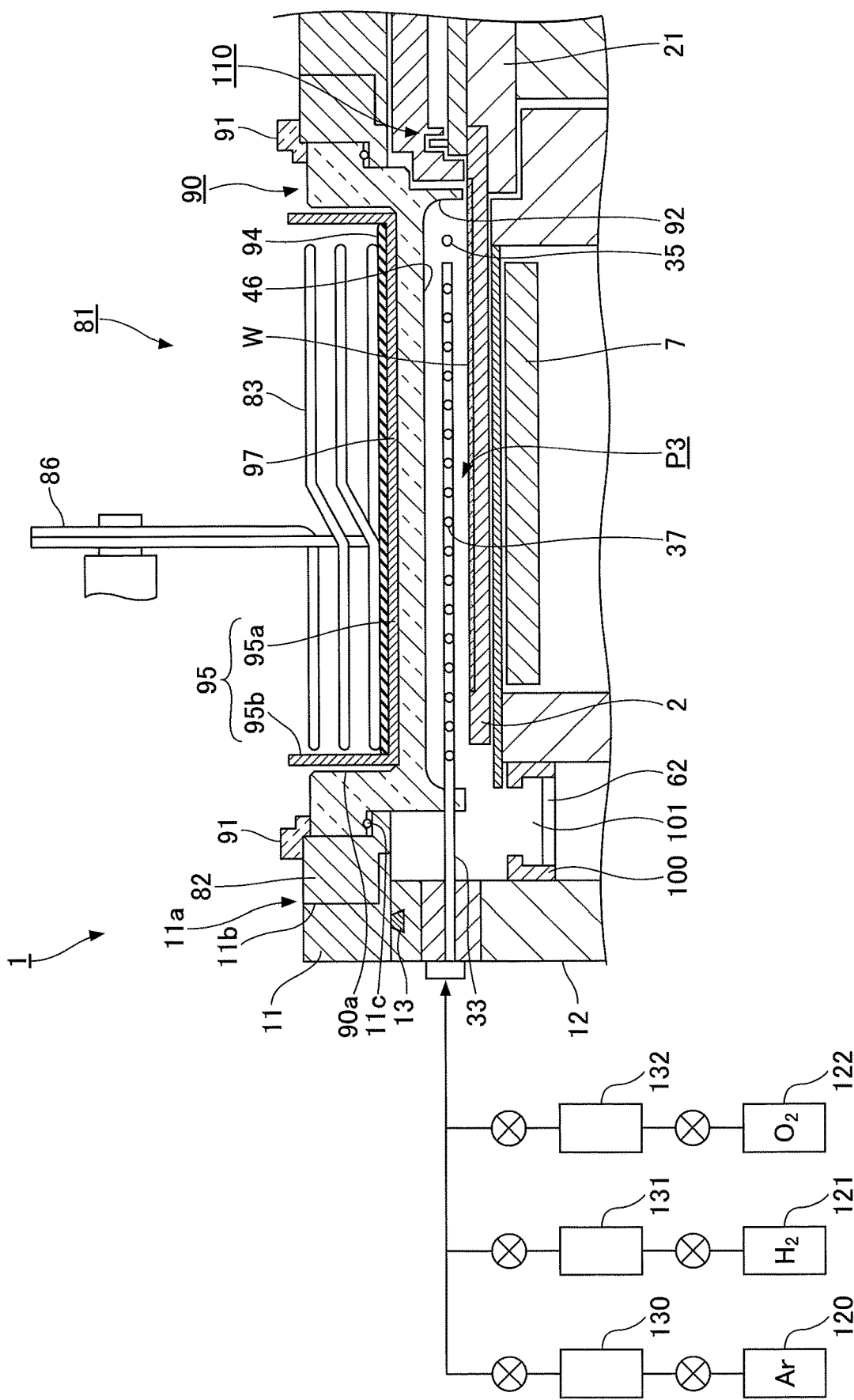
FIG. 7 is a vertical cross-sectional view of an example of a substrate generator of a substrate processing apparatus according to an embodiment of the present disclosure.
Figure 8:
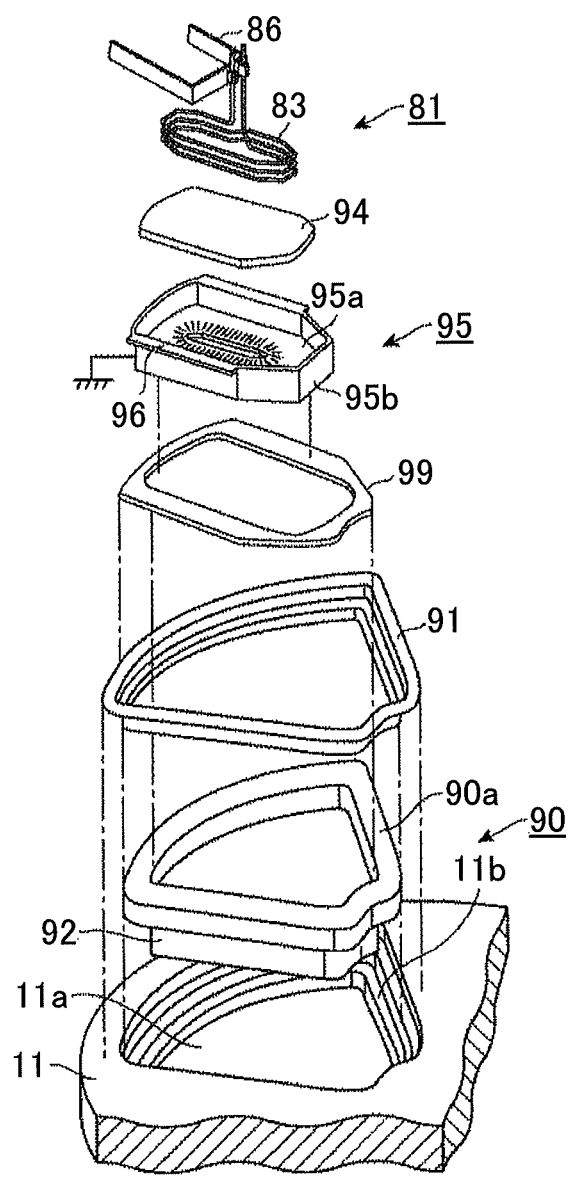
FIG. 8 is an exploded perspective view of an example of a substrate generator of a substrate processing apparatus according to an embodiment of the present disclosure.
Figure 9:
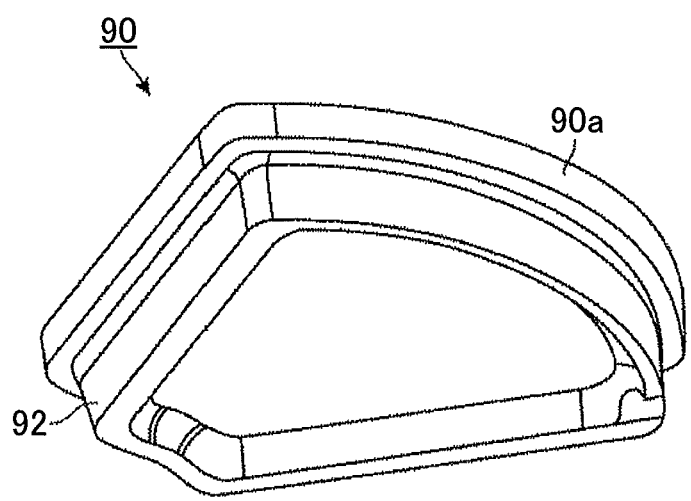
FIG. 9 is a perspective view of an example of a housing of a substrate generator of a substrate processing apparatus according to an embodiment of the present disclosure.

FIG. 7 is a vertical cross-sectional view of an example of the plasma generator. FIG. 8 is an exploded perspective view of an example of the plasma generator. FIG. 9 is a perspective view of an example of a housing 90 of the plasma generator.

The plasma generator 81 is configured by winding an antenna 83 made of a metal wire or the like, for example, three times around a vertical axis in a coil form. In plan view, the plasma generator 81 is disposed to surround a strip-shaped area extending in the radial direction of the turntable 2 and to extend across the diameter of the wafer W on the turntable 2.

The antenna 83 is connected through a matching box 84 to a high frequency power source 85 that has, for example, a frequency of 13.56 MHz and output power of 5000 W. The antenna 83 is hermetically separated from the inner area of the vacuum chamber 1. As illustrated in FIGS. 1, 2, and 7, a connection electrode 86 electrically connects the antenna 83, the matching box 84, and the high frequency power source 85.

As illustrated in FIGS. 7 and 8, an opening 11a having an approximately fan-like shape in plan view is formed in the top plate 11 above the plasma processing gas nozzle 33.

As illustrated in FIG. 7, a ring-shaped member 82 is hermetically attached to the periphery of the opening 11a. The ring-shaped member 82 extends along the periphery of the opening 11a. The housing 90 is hermetically attached to the inner circumferential surface of the ring-shaped member 82. That is, the outer circumferential surface of the ring-shaped member 82 faces an inner surface 11b of the opening 11a of the top plate 11, and the inner circumferential surface of the ring-shaped member 82 faces a flange part 90a of the housing 90. The housing 90 is placed via the ring-shaped member 82 in the opening 11a to enable the antenna 83 to be placed at a position lower than the top plate 11. The housing 90 may be made of a dielectric material such as quartz. The bottom surface of the housing 90 forms a ceiling surface 46 of the plasma process region P3.

As illustrated in FIG. 6, an upper peripheral part surrounding the entire circumference of the housing 90 extends horizontally to form the flange part 90a. Moreover, a central part of the housing 90 in plan view is recessed toward the inner area of the vacuum chamber 1.

The housing 90 is arranged so as to extend across the diameter of the wafer W in the radial direction of the turntable 2 when the wafer W is located under the housing 90. A seal member 11c such as an O-ring is provided between the ring-shaped member 82 and the top plate 11.

The internal atmosphere of the vacuum chamber 1 is hermetically sealed by the ring-shaped member 82 and the housing 90. As illustrated in FIG. 5, the ring-shaped member 82 and the housing 90 are placed in the opening 11a, and the entire circumference of the housing 90 is pressed downward via a frame-shaped pressing member 91 that is placed on the upper surfaces of the ring-shaped member 82 and the housing 90 and extends along a contact region between the ring-shaped member 82 and the housing 90. The pressing member 91 is fixed to the top plate 11 with, for example, bolts (not illustrated in the drawing). As a result, the internal atmosphere of the vacuum chamber 1 is sealed hermetically. In FIG. 5, a depiction of the ring-shaped member 82 is omitted for simplification.

As illustrated in FIG. 7, the housing 90 also includes a protrusion 92 that extends along the circumference of the housing 90 and protrudes vertically from the lower surface of the housing 90 toward the turntable 2. The protrusion 92 surrounds the second process region P2 below the housing 90. The plasma processing gas nozzle 33 is accommodated in an area surrounded by the inner circumferential surface of the protrusion 92, the lower surface of the housing 90, and the upper surface of the turntable 2. A part of the protrusion 92 near a base end (at the inner wall of the vacuum chamber 1) of each of the plasma processing gas nozzles 33 is cut off to form an arc-shaped cut-out that conforms to the outer shape of each of the plasma processing gas nozzle 33.

Also, as shown in FIG. 7, the plasma processing gas nozzle 33 is provided in a third process region P3 below the housing 90 and is connected to an argon gas source 120, a hydrogen gas source 121, and an oxygen gas source 122. Also, the corresponding flow controllers 130, 131 and 132 are provided between the plasma processing gas nozzle 33 and the argon gas source 120, the hydrogen gas source 121, and the oxygen gas source 122. The argon gas source 120, the hydrogen gas source 121, and the oxygen gas source 122 supply Ar gas, $H_2$ gas, and $O_2$ gas to the plasma processing gas nozzle 33 via the flow controllers 130, 131 and 132, respectively, at a predetermined flow rate ratio (mixing ratio), and flow rates of Ar gas, $H_2$ gas, and O2 gas are determined depending on the region to be supplied.

Figure 10:
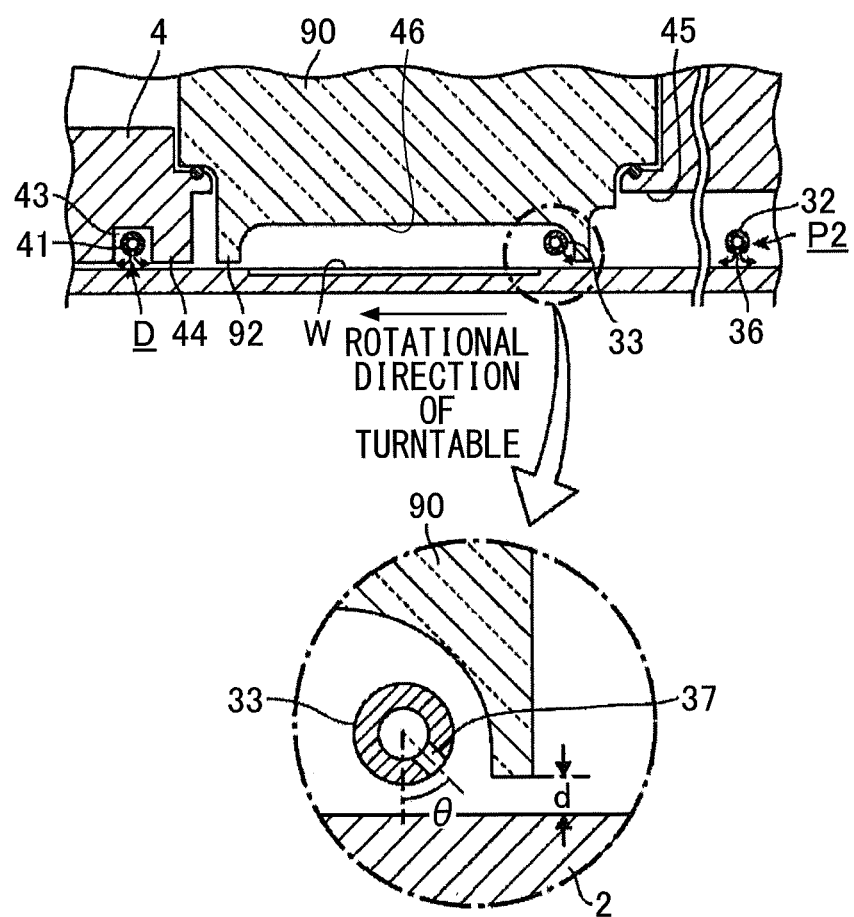
FIG. 10 is a vertical cross-sectional view of a vacuum chamber taken along a rotational direction of a turntable of a substrate processing apparatus according to an embodiment of the present disclosure.

FIG. 10 is a vertical cross-sectional view of the vacuum chamber 1 taken along the rotational direction of the turntable 2. As illustrated in FIG. 7, because the turntable 2 rotates in a clockwise fashion during the plasma process, Ar gas is likely to intrude into an area under the housing 90 from a clearance between the turntable 2 and the protrusion 92 by being brought by the rotation of the turntable 2. To prevent Ar gas from intruding into the area under the housing 90 through the clearance, a gas is discharged to the clearance from the area under the housing 90. More specifically, as illustrated in FIGS. 7 and 10, the gas discharge holes 36 of the plasma processing gas nozzle 34 are arranged to face the clearance, that is, to face the upstream side in the rotational direction of the turntable 2 and downward. A facing angle θ of the gas discharge holes 36 of the plasma processing gas nozzle 33 relative to the vertical axis may be, for example, about 45 degrees as illustrated in FIG. 10, or may be about 90 degrees so as to face the inner side wall of the protrusion 92. In other words, the facing angle θ of the gas discharge holes 36 may be set at an appropriate angle capable of properly preventing the intrusion of Ar gas in a range from 45 to 90 degrees depending on the intended use.

Next, a detailed description is given below of a Faraday shield 95 of the plasma generator 81. As illustrated in FIGS. 7 and 8, a Faraday shield 95 is provided on the upper side of the housing 90. The Faraday shield 95 is grounded, and is composed of a conductive plate-like part such as a metal plate (e.g., copper plate) that is shaped to roughly conform to the internal shape of the housing 90. The Faraday shield 95 includes a horizontal surface 95a that extends horizontally along the bottom surface of the housing 90, and a vertical surface 95b that extends upward from the outer edge of the horizontal surface 95a and surrounds the horizontal surface 95a. The Faraday shield 95 may be configured to be, for example, a substantially hexagonal shape in a plan view.

Figure 11:
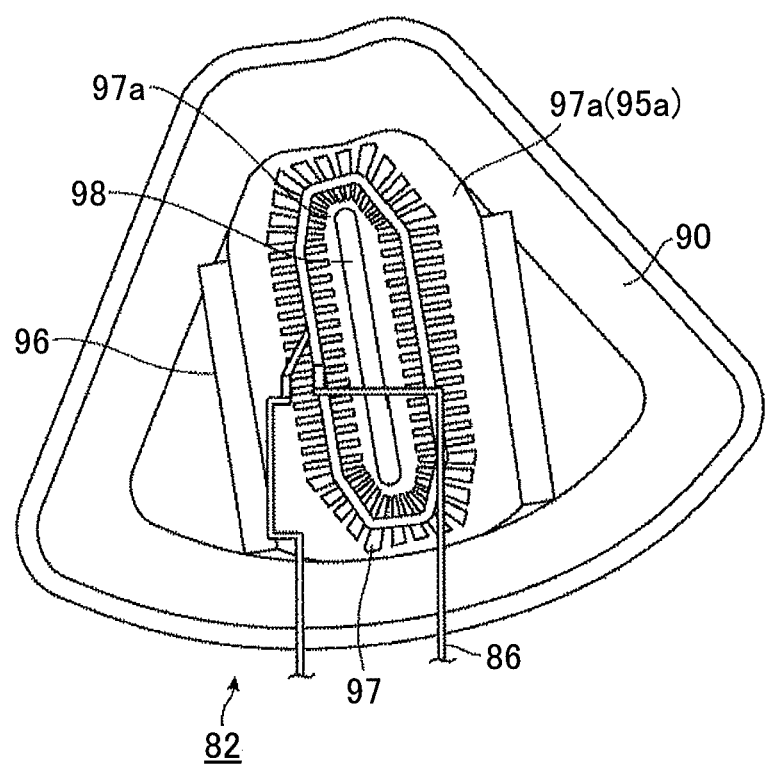
FIG. 11 is a plan view of an example of a substrate generator of a substrate processing apparatus according to an embodiment of the present disclosure.
Figure 12:
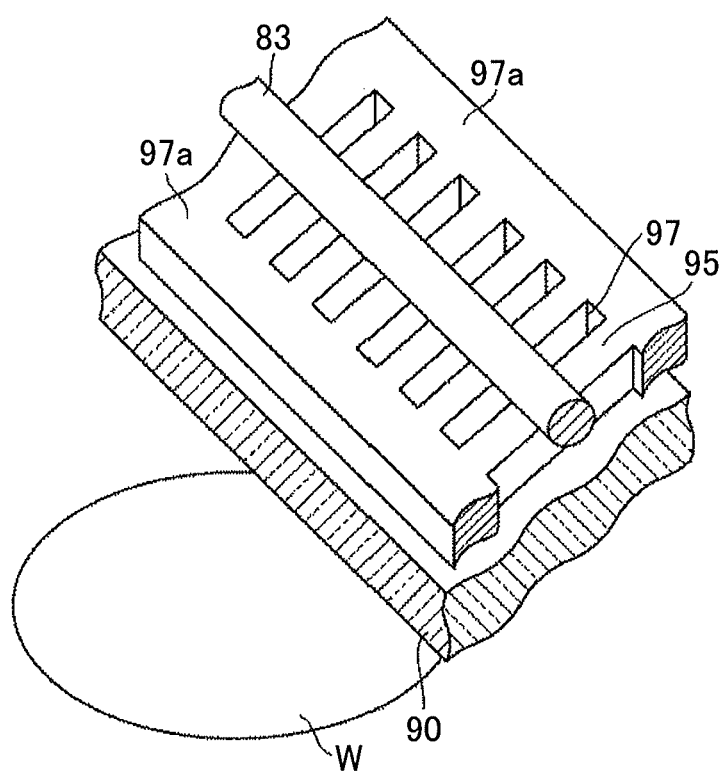
FIG. 12 is a perspective view illustrating a part of a Faraday shield provided in a substrate generator of a substrate processing apparatus according to an embodiment of the present disclosure.

FIG. 11 is a plan view of an example of the plasma generator 81. FIG. 12 is a perspective view of a part of the Faraday shield 95 provided in the plasma generator 81.

When seen from the rotational center of the turntable 2, the right and left upper ends of the Faraday shield 95 extend horizontally rightward and leftward, respectively, to form supports 96. A frame 99 is provided between the Faraday shield 95 and the housing 90 to support the supports 96 from below. The frame 99 is supported by a part of the housing 90 near the central area C and a part of the flange part 90a near the outer edge of the turntable 2.

When an electric field reaches the wafer W, for example, electric wiring and the like formed inside the wafer W may be electrically damaged. To prevent this problem, a plurality of slits 97 is formed in the horizontal surface 95a. The slits 97 prevent an electric-field component of an electric field and a magnetic field (electromagnetic field) generated by the antenna 83 from reaching the wafer W below the Faraday shield 95, and allow a magnetic field component of the electromagnetic field to reach the wafer W.

As illustrated in FIGS. 11 and 12, the slits 97 extend in directions that are orthogonal to the direction in which the antenna 83 is wound, and are arranged to form a circle below the antenna 83. The width of each slit 97 is set at a value that is about 1/10000 or less of the wavelength of a high frequency supplied to the antenna 83. Circular electrically-conducting paths 97a made of, for example, a grounded conductor are provided at the ends in the length direction of the slits 97 to close the open ends of the slits 97. An opening 98 is formed in an area of the Faraday shield 95 where the slits 97 are not formed, i.e., an area surrounded by the antenna 83. The opening 98 is used to check whether plasma is emitting light. In FIG. 2, the slits 97 are omitted for simplification, but an area where the slits 97 are formed is indicated by a dashed-dotted line.

As illustrated in FIG. 8, an insulating plate 94 is stacked on the horizontal surface 95a of the Faraday shield 95. The insulating plate 94 is made of, for example, quartz having a thickness of about 2 mm, and is used for insulation between the Faraday shield 95 and the plasma generator 81 disposed above the Faraday shield 95. Thus, the plasma generator 81 is arranged to cover the inside of the vacuum chamber 1 (i.e., the wafer W on the turntable 2) through the housing 90, the Faraday shield 95, and the insulating plate 94.

Next, other components of the substrate processing apparatus according to the present embodiment are described below.

As illustrated in FIG. 2, a side ring 100, which is a cover, is provided along the outer circumference of the turntable 2 and slightly below the turntable 2. An exhaust opening 66 is formed downstream of the third process region P3 in the upper surface of the side ring 100. In other words, the floor surface of the vacuum container 1 has an exhaust port, and the side ring 100 at a position corresponding to these exhaust ports has an exhaust opening 66.

As described in FIG. 6, since the exhaust port 65 extends upward to the vicinity of the ceiling surface of the top plate 11 of the vacuum chamber 1, no exhaust opening is formed that is exposed to the floor surface of the vacuum chamber 1.

In the substrate processing apparatus according to this embodiment, an exhaust part 60 and an exhaust opening 66 are provided. The exhaust part 60 is disposed at a position closer to the separation region D between the first processing gas nozzle 31 and the separation region D positioned downstream of the turntable 2 relative to the first processing gas nozzle 31. Further, the exhaust opening 66 is disposed at a position closer to the separation region D between the plasma generator 81 and the separation region D downstream of the plasma generator 81 in the rotational direction of the turntable 2.

As described above, the exhaust part 60 is to evacuate the first process gas or the separation gas. On the other hand, the exhaust opening 66 is to evacuate the plasma processing gas or the separation gas. The exhaust part 60 and the exhaust opening 66 are each connected to a vacuum evacuation mechanism, for example, a vacuum pump 68, via an exhaust pipe 67 with a pressure regulator 69, such as a butterfly valve.

As described above, because the housing 90 is disposed from the center region C side to the outer edge side, the gas flowing from the upstream of the turntable 2 to the process region P2 in the rotational direction may restrict the gas flow to the exhaust opening 66 by the housing 90. Accordingly, a groove-like gas flow passage 101 for gas flow is formed on the upper surface of the side ring 100 on the outer periphery of the housing 90.

As shown in FIG. 1, the center portion of the lower surface of the top plate 11 is formed along a circumferential direction having a ring-like shape continuously from the center region C in the convex portion 4, and has a protruding portion 5 having a lower surface that is formed at the same height as the lower surface of the convex portion 4 (the ceiling surface 44). A labyrinth structure 110 is disposed above the core portion 21 at the center of the turntable 2 from the protrusion 5 to prevent various gases from mixing with each other in the center region C.

As described above, the housing 90 extends up to a location near the central area C. Therefore, the core portion 21 for supporting the central part of the turntable 2 is formed near the rotational center so that a part of the core portion 21 above the turntable 2 does not contact the housing 90. For this reason, compared with outer peripheral areas, gases are likely to mix with each other in the central area C. The labyrinth structure 110 above the core portion 21 lengthens gas flow passage and thereby prevents gases from mixing with each other.

As illustrated in FIG. 1, a heater unit 7 is provided in a space between the turntable 2 and the bottom part 14 of the vacuum chamber 1. The heater unit 7 can heat, through the turntable 2, the wafer W on the turntable 2 to a temperature, for example, in a range from about room temperature to about 300 degrees C. In FIG. 1, a side covering member 71a is provided on a lateral side of the heater unit 7, and an upper covering member 7a is provided above the heater unit 7 to cover the heater unit 7. Purge gas supply pipes 73 are provided in the bottom part 14 of the vacuum chamber 1 below the heater unit 7. The purge gas supply pipes 73 are arranged at a plurality of locations along the circumferential direction and used to purge the space where the heater unit 7 is placed.

As illustrated in FIG. 2, the transfer opening 15 is formed in the side wall of the vacuum chamber 1. The transfer opening 15 is used to transfer the wafer W between a transfer arm 10 and the turntable 2. A gate valve G is provided to hermetically open and close the transfer opening 15. A camera unit 10a is provided above the top plate 11 in an area where the transfer arm 10 is moved into and out of the vacuum chamber 1. The camera unit 10a is used to detect the outer edge (or rim) of the wafer W. The camera unit 10a captures an image of the outer edge of the wafer W and thereby detects, for example, whether the wafer W is on the transfer arm 10, misalignment of the wafer W on the turntable 2, and misalignment of the wafer W on the transfer arm 10. The camera unit 10a is configured to have a wide field of view that covers the diameter of the wafer W.

The wafer W is transferred between the concave portion 24 of the turntable 2 and the transfer arm 10 when the concave portion 24 is at a position (transfer position) facing the transfer opening 15. For this reason, lifting pins and an elevating mechanism (not illustrated in the drawings) for lifting the wafer W are provided at the transfer position under the turntable 2. The lifting pins pass through the concave portion 24 and push the back surface of the wafer W upward.

The plasma processing apparatus of the embodiment also includes a controller 140 implemented by a computer for controlling the operations of the entire substrate processing apparatus. The controller 140 includes a memory that stores a program for causing the substrate processing apparatus to perform a substrate process described later. The program may include steps for causing the substrate process apparatus to perform various operations. The program may be stored in a storage unit 121 that forms a storage medium such as a hard disk, a compact disc, a magneto-optical disk, a memory card, or a flexible disk, and installed from the storage unit 141 into the controller 140.

The exhaust part 60 may be provided not only for the first processing gas nozzle 31 of the first process region P1, but also for the second processing gas nozzle 32 of the second process region P2 and the plasma processing gas nozzle 33 of the third process region P3. Efficient evacuation of the process gas can be achieved because evacuation from the upper and lower parts can be performed. Here, the exhaust part 60 works more efficiently when there is a space partition member, such as the nozzle cover 34 that divides the area above the turntable 2 of the vacuum chamber 1 into the space above and below the turntable 2.

In the plasma process region P3, when a space is formed between the housing 90 and the top plate 11 of the vacuum container 1, the separation gas and the like can be evacuated at the upper location, and the process gas such as plasma and radical can be evacuated at the lower location, and the same effect as described in FIGS. 2-6 can be obtained. Similarly, in the second process region P2, when the nozzle cover 34 or a hanging type showerhead is provided above the second processing gas nozzle 32, the exhaust part 60 has a significant effect.

Although examples of combinations of the process gas nozzle 31 and the nozzle cover 34 have been cited in this embodiment, similar effects can be obtained when a showerhead type gas supply unit is provided that forms a space between its top surface and the ceiling surface of the top plate 11 of the vacuum container 1.

In the present embodiment, a turntable type film deposition apparatus that performs ALD has been described as an example. However, if the substrate is placed on a turntable (susceptor) 2; the processing gas is supplied to perform substrate processing; and evacuation of the processing gas is required, the process can be applied to various substrate processing.

[Operation of Substrate Processing Apparatus]

Next, an example of the operation of the substrate processing device according to this embodiment is described below. The drawings described above are referred to for explanation, and the corresponding components are given the same reference numerals and the description thereof is omitted.

First, in FIG. 2, wafers W are carried into vacuum chamber 1. When carrying substrates such as wafers W into the vacuum chamber 1, the gate valve G is opened. The turntable 2 is rotated intermittently, and the substrates are placed on the turntable 2 through the transfer port 15 by the transfer arm 10.

Next, the gate valve G is closed, and the pressure in the vacuum chamber 1 is adjusted to a predetermined pressure value by the vacuum pump 68 and the pressure controller 69. Then, the wafers W are heated to a predetermined temperature by the heater unit 7 while rotating the turntable 2. At this time, a separation gas, for example, $N_2$ gas is supplied from the separation gas nozzles 41 and 42.

Here, the exhaust part 60 starts an evacuation from both the exhaust duct 61 and the upper exhaust part 63. In the meantime, an evacuation starts from the exhaust port 66.

Subsequently, the first processing gas nozzle 31 supplies a first process gas, and the second processing gas nozzle 32 supplies a second process gas. Moreover, the plasma processing gas nozzle 33 supplies a plasma processing gas at a predetermined flow rate.

Here, although a variety of gases may be used as the first process gas, the second process gas and the plasma processing gas, the first processing gas nozzle 31 supplies a source gas, and the second processing gas nozzle 32 supplies an oxidation gas or a nitriding gas. Moreover, the plasma processing gas nozzle 33 supplies an oxidation gas or a nitriding gas similar to the oxidation gas and the nitriding gas supplied from the second processing gas nozzle, and a plasma processing gas composed of a mixed gas containing a noble gas.

Here, an example will be described in which the film to be deposited is a silicon oxide film, the first process gas is an aminosilane gas, the second process gas is an oxygen gas, and the plasma processing gas is a mixed gas of $H_2$, Ar, and $O_2$.

The first process gas is primarily evacuated from the lower exhaust opening 62 of the exhaust part 60, and the separation gas ($N_2$) gas is primarily evacuated from the upper exhaust part 63. Although the two gases are not necessarily completely separated, the first process gas is evacuated more from the lower exhaust opening 62 than the separation gas, and the separation gas is evacuated more from the upper exhaust opening 64 than the first process gas.

A Si-containing gas or a metal containing gas is adsorbed on the surface of the wafer in the first process region P1 due to the rotation of the turntable 2, and then the Si-containing gas adsorbed on the surface of the wafer W is oxidized by oxygen gas in the second process region P2. Thus, one or more molecular layers of a silicon oxide film that is a component of a thin film are deposited on the surface of the wafer W and a reaction product is deposited on the surface of the wafer W.

On this occasion, the separation gas and the process gas are properly evacuated, and the film deposition process with high uniformity across the surface of the wafer W can be performed.

When the turntable 2 further rotates, the wafer W reaches the plasma process region P3, and a modification process of the silicon oxide film by a plasma process is performed. With respect to the plasma processing gas supplied in the plasma process region P3, for example, a mixture of Ar, $H_2$, $O_2$ is supplied.

When the plasma process is performed in the plasma process region P3, radio frequency power of a predetermined output is supplied to the antenna 83 at the plasma generator 81.

In the housing 90, the electric field of the electromagnetic field generated by the antenna 83 is prevented from entering the vacuum chamber 1 by being reflected, absorbed or attenuated by the Faraday shield.

The Faraday shield 95 includes the electrically-conducting paths 97a at the ends in the length direction of the slits 97, and the vertical surface 95b disposed lateral to the antenna 83. This configuration also blocks the electric field that is likely to go around the slits 97 and move toward the wafer W through areas at the ends in the length direction of the slits 97.

On the other hand, because the slits 97 are formed in the Faraday shield 95, the magnetic field passes through the slits 97 of the Faraday shield 95, and enters the vacuum chamber 1 through the bottom surface of the housing 90. As a result, the plasma processing gases are converted into plasma by the magnetic field in an area under the housing 90. This makes it possible to generate plasma including many active species that are less likely to electrically damage the wafer W.

In the present embodiment, by continuing to rotate the turntable 2, the adsorption of the source gas on the surface of the wafer W, oxidation or nitriding of components adsorbed on the wafer surface, and plasma modification of the reaction product are performed in this order many times. In other words, the film deposition process by ALD and the modification process of the deposited film are performed many times by the rotation of the turntable 2.

In the plasma processing apparatus of the present embodiment, the separation areas D are provided between the first and second process regions P1 and P2, and between the third and first process regions P3 and P1 along the circumferential direction of the turntable 2. Thus, the process gas and the plasma processing gas are prevented from mixing with each other by the separation areas D, and are evacuated toward the lower exhaust opening 62 and the upper exhaust opening 64 of the exhaust part 60, and the exhaust opening 66.

The first process gas of the present embodiment may be a silicon-containing gas such as DIPAS [diisopropylaminosilane], 3DMAS [trisdimethylaminosilane] gas, BTBAS [bistertialbutylaminosilane], DCS [dichlorosilane], and HCD [hexachlorodisilane] as examples.

In addition, when the plasma processing method according to the embodiment of the present invention is applied to film deposition of a TiN film, the first process gas may be a metal containing gas such as $TiCl_4$ [titanium tetrachloride], Ti(MPD)(THD) [titanium methylpentanedionatobistetramethylheptanedionato], TMA [trimethylaluminum], TEMAZ [tetrakisethylmethylaminozirconium], TEMHF [tetrakisethylmethylaminohafnium], and Sr(THD)2 [strontium bistetramethylheptanedionato].

In the present embodiment, the plasma processing gas is described by citing an example of using Ar gas and He gas as the noble gases by combining with oxygen gas for modification, but another noble gas may be used, and ozone gas or moisture can be used instead of oxygen gas.

In a process for depositing a nitriding film, $NH_3$ gas or $N_2$ gas may be used for modification. Furthermore, a mixed gas further containing a hydrogen-containing gas (e.g., $H_2$ gas, $NH_3$ gas) may be used as necessary.

As the separation gas, for example, Ar gas and He gas are cited as examples in addition to $N_2$ gas.

Although the flow rate of the first process gas during the film deposition process is not limited to a specific value, the flow rate of the first process gas during the film deposition process can be set in, for example, a range from 50 sccm and 1000 sccm.

Although the flow rate of the oxygen-containing gas contained in the plasma processing gas is not limited to a specific value, the flow rate of the oxygen-containing gas contained in the plasma processing gas can be, for example, set in a range from about 500 sccm to about 5000 sccm (e.g., 500 sccm as an example).

Although the pressure in the vacuum chamber 1 is not limited to a specific value, the pressure can be, for example, set in a range from 0.5 Torr to about 4 Torr (e.g., 1.8 Torr as an example).

Although the temperature of the wafer W is not limited to a specific value, the temperature can be set, for example, in a range from about 40 degrees C. to about 650 degrees C.

Although the rotational speed of the turntable 2 is not limited to a specific value, the rotational speed can be set, for example, in a range from about 60 rpm to about 300 rpm.

According to the substrate processing apparatus in the present embodiment, an evacuation can be efficiently performed by providing an upper location evacuation and a lower location evacuation, and the concentration of the process gas can be appropriately controlled, thereby performing substrate processing with high uniformity across a surface of a wafer. In particular, when the substrate processing apparatus is configured as a film deposition apparatus, the uniformity of the film thickness across the wafer and the uniformity of the film quality across the wafer can be improved.

Thus, according to the substrate processing apparatus of the embodiments of the present disclosure, an upper space and a lower space in a process region separated by a spatial partition member can be efficiently evacuated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. A substrate processing apparatus, comprising:
a process chamber;
a turntable disposed in the process chamber, a surface of the turntable receiving a substrate along a circumferential direction;
a process gas supply part including a process gas discharge surface configured to supply a process gas to the turntable;
a space partition extending from the process gas discharge surface toward a downstream side of the process gas discharge surface in a rotational direction of the turntable and configured to cover a part of the turntable and to form a lower space between the space partition and the turntable, and an upper space between the space partition and a ceiling surface of the process chamber;
an exhaust duct disposed downstream of the space partition in the rotational direction of the turntable and extending along a radial direction of the turntable, the exhaust duct having a lower exhaust opening in its lateral surface at a first position lower than the space partition; and
an upper exhaust opening disposed at a second position higher than the space partition.

2. The substrate processing apparatus as claimed in claim 1,
wherein the process gas discharge surface includes a plurality of process gas discharge holes disposed along the radial direction of the turntable, and
wherein the lower exhaust opening includes a plurality of lower exhaust openings disposed along a lengthwise directions of the exhaust duct.

3. The substrate processing apparatus as claimed in claim 2, wherein the upper exhaust opening is disposed outside the turntable in a lateral direction, and wherein the exhaust duct extends from an outside of the turntable toward a center of the turntable.

4. The substrate processing apparatus as claimed in claim 3, wherein the upper exhaust opening and the exhaust duct are connected to a common exhaust passage disposed outside the turntable in the lateral direction.

5. The substrate processing apparatus as claimed in claim 1,
wherein the process gas supply part is a process gas nozzle extending in the radial direction of the turntable, and
wherein the space partition is a nozzle cover including a current plate configured to cause a flow of the process gas supplied from the process gas nozzle to become approximately parallel to the surface of the turntable, and a nozzle housing configured to cover the process gas nozzle and connected to the current plate.

6. The substrate processing apparatus as claimed in claim 5,
wherein the current plate has a fan-like shape whose arc length increases from the center side toward the outer edge side, and
wherein the space partition includes a second current plate that extends upstream of the process gas supply nozzle.

7. The substrate processing apparatus as claimed in claim 1, further comprising:
a purge gas supply part disposed upstream of the process gas supply part in the rotational direction of the turntable and configured to supply a purge gas to the turntable,
wherein the upper exhaust opening evacuates the purge gas flowing above the space partition more than the process gas, and wherein the lower exhaust opening evacuates the process gas supplied to a location lower than the space partition more than the purge gas.

8. The substrate processing apparatus as claimed in claim 7, wherein the process gas supply part is a source gas supply part configured to supply a source gas.

9. The substrate processing apparatus as claimed in claim 8, further comprising;
 a second purge gas supply part disposed downstream of the source gas source gas supply part in the rotational direction of the turntable and configured to supply a second purge gas to the turntable; and
 a reaction gas supply part disposed downstream of the second purge gas supply part in the rotational direction of the turntable and configured to supply a reaction gas capable of producing a reaction product,
 wherein a film is deposited on the substrate by ALD by causing the substrate to pass positions under the purge gas supply part, the source gas supply part, the second purge gas supply part, and the reaction gas supply part while the turntable is rotated.

10. The substrate processing apparatus as claimed in claim 9, further comprising:
 a plasma gas supply part disposed between the reaction gas supply part and the purge gas supply part and configured to modify the reaction product produced by ALD by supplying a plasma processing gas to the turntable.

* * * * *